United States Patent [19]
Tamaki

[11] Patent Number: 5,912,847
[45] Date of Patent: Jun. 15, 1999

[54] SEMICONDUCTOR MEMORY DEVICE HAVING A SAVE REGISTER FOR READ DATA

[75] Inventor: Satoshi Tamaki, Tokyo, Japan

[73] Assignee: NEC Corporation, Tokyo, Japan

[21] Appl. No.: 09/120,738

[22] Filed: Jul. 23, 1998

[30] Foreign Application Priority Data

Jul. 24, 1997 [JP] Japan ..................................... 9-198339

[51] Int. Cl.⁶ ...................................................... G11C 7/00
[52] U.S. Cl. ................ 365/189.05; 365/233; 365/189.02
[58] Field of Search .............................. 365/189.05, 233, 365/239, 240, 230.08, 189.02, 230.02

[56] References Cited

U.S. PATENT DOCUMENTS 5,631,866  5/1997  Oka et al. ........................... 365/189.05
5,694,370  12/1997  Yoon .................................... 365/189.05

FOREIGN PATENT DOCUMENTS 7-18287  7/1995  Japan .

*Primary Examiner*—Vu A. Le
*Attorney, Agent, or Firm*—Sughrue, Mion, Zinn, Macpeak & Seas, PLLC

[57] ABSTRACT

A synchronous dynamic random access memory (SDRAM) comprises a save register for temporarily storing in a write cycle read data read from one of memory cells in a preceding read cycle, and a selector for selecting data from the save register or data from a read section. The saved data is output in a next read cycle succeeding the write cycle in which the data is saved.

6 Claims, 10 Drawing Sheets

SEMICONDUCTOR MEMORY DEVICE HAVING A SAVE REGISTER FOR READ DATA

BACKGROUND OF THE INVENTION (a) Field of the Invention

The present invention relates to a semiconductor memory device having a save register for a read data and, more particularly, to a semiconductor memory device implemented as a synchronous dynamic random access memory (SDRAM).

(b) Description of the Related Art

SDRAMs are increasingly used for a computer system because of its high-speed operation FIG. 1 illustrates a block diagram of a conventional SDRAM, and FIG. 2 is a signal timing chart of the SDRAM of FIG. 2. The conventional SDRAM comprises a peripheral circuit in a peripheral region of the SDRAM 1 for controlling read/write operations of a memory cell array 6. In the control of the memory cell array 6, the column access involves a clock delay, or CAS (column address strobe) latency, in a read cycle between the time instants of the input of a read command and the output of the read data.

In FIG. 1, SDRAM 1 comprises an address/command input section 2, a control section 3, a Y-address latch/decode section 4, an X-address decode and ROW control section 5, a memory cell array 6, a data amplifier 7, a data-out latch 8, a data input section 9, a write buffer 10, and a data-out buffer 17, which operate in synchrony with an external clock signal. The clock signal 1501 input through a clock signal input terminal 15 is delivered within the SDRAM 1 through a clock signal line. The input of the address/command input section 2 is connected to external input terminals 11, whereas the input/output terminals 12 are connected to an external bus line. The control section 3 controls operations of the entire SDRAM 1.

The X-address decode and ROW control section 5, operating based on X-address/control signals 302 output from the control section 3, determines X-address of the specified memory cell in the cell array.6. Data are read from or stored in the memory cell by determining the cell address by the Y-address latch/decode section 4 and the X-address decode and ROW control section 5. The data amplifier 7 amplifies the data thus read out. The data-out latch 8 outputs the data amplified by the data amplifier 7 to data input/output terminals 12 via the data-out buffer 17 in synchrony with the clock signal. The data input section 9, operating in synchrony with the clock signal, latches write data input through the input/output terminals 12. The write buffer 10 writes the write data to the specified memory cell in the memory cell array 6. A plurality of serial Y-address latch/decode sections 4 and data-out latches 8 may be disposed in the case of a large CAS.

Referring to FIG. 2, there is shown an example of read and write operations in the memory device of FIG. 1, wherein R1 to R11 shown on the row of CMD+ADD(11) are read commands and W1 to W8 are write commands. In a read cycle, a read command R1, for example, input through the address/command input terminals 11, is latched in the address/command input section 2 in synchrony with the clock signal input through the clock input terminal 15.

Subsequently, the read address (column address) is determined by latching the Y-address in the Y-address latch/decode section 4 in synchrony with the clock signal, and the read data is output from the specified memory cell. The read data is then amplified by the data amplifier 7 and, after being latched in the data-out latch 8 in synchrony with the next clock signal, output through the data input/output terminals 12 via the data-out buffer 17.

In the conventional SDRAM, output of the read data through the data input/output terminals 12 starts at the third clock counted from the first clock for latching the address and the command signals. The actual reading of the data starts at the fourth clock, thereby involving a CAS latency, as shown in FIG. 2.

On the other hand, when a write command W1, for example, is input through the address/command input terminals 11, the write command W1 is latched in the address/command input section 2 in synchrony with the clock signal. Then, the write address (column address) is determined by latching the Y-address in the Y-address latch/decode section 4 in synchrony with the clock signal. The write data, input through the data input/output terminals 12 in synchrony with the clock signal, is input and written in the specified memory cell through the write buffer 10 after being latched by the data input section 9. The process from latching the write command signal to the completion of the write Operation is performed in two clocks.

With the conventional SDRAM of FIG. 1, a write command cannot be input until data being read out is delivered to outside the memory device due to the latency in a read cycle. Accordingly, there arises the problem that alternate read operations with write operations in the SDRAM significantly decreases the effective bandwidth of the data input/output terminals 12.

FIG. 3 illustrates a schematic diagram of another conventional semiconductor memory device implemented as a synchronous static random access memory (referred to as SSRAM, hereinafter), which is described in JP-A-7(1995)-182870. FIG. 4 shows a signal timing chart for the SSRAM of FIG. 3. An external address signal ADD shown in FIG. 4 is supplied to comparators 35 as an internal address signal W2ADD via a buffer circuit 21 and latch circuits 23, 25, 26 and 27. An output address signal is supplied from the latch circuit 23 to a multiplexer 34 as an internal address signal RADD via a latch circuit 31. An output signal from the latch circuit 26 is supplied to the multiplexer 34 and the comparators 35 as an internal address signal W1ADD via latch circuits 28, 29 and 30.

An external write-enable signal NWE is supplied via a buffer circuit 22 and a latch circuit 24 to a latch circuit 32, and latched therein. An output from the latch circuit 32 is supplied to the multiplexer 34, a read circuit 37 and a write circuit 38 of the memory cell array 36, and an AND gate 33 after inversion as an internal write-enable signal NWEin. An output signal from the latch circuit 32 is also supplied to an AND gate 42 via latch circuits 40 and 41 after inversion.

An internal clock signal PH1 obtained by receiving an external clock signal CLK through a buffer 56 is input to the other input terminals of the AND gates 33 and 42. An output signal PH1-WE from the AND gate 33 is supplied as a latch pulse to the latch circuits 25 and 28, and an output signal PH1-WED from the AND gate 42 is supplied as a latch pulse to latch circuits 53 and 55.

Among the I/O signals shown in FIG. 10, write data such as DW0 supplied from outside is latched by the latch circuit 53 via a buffer 52 as write data WD2. The latched data WD2 is further transferred via a buffer 54 to the latch circuit 55 and latched therein as write data WD1. The write data WD1, together with the write data WD2, is supplied to a multiplexer 45 as well as the write section 38.

One of the two comparators 35 outputs a high-level signal when the internal address signals W1ADD and RADD coincide. The other of the two comparators 35 outputs a high-level signal when the internal address signals W2ADD and RADD coincide. AND gates 43 and 44 receive output signals from the comparators 35 and the internal write-enable signal NWEin to output an H-level signal when both input signals are at H-level. The multiplexer 45 selects the write data WD1 and supplies the same to a multiplexer 47 when the output signal from the AND gate 43 is at H-level, or the write data WD2 when the output signal from the AND gate 44 is at H-level.

The multiplexer 47 outputs the data input from the multiplexer 45 when the output from an OR gate 46 making OR of the output signals from the AND gates 43 and 44 is at H-level, or outputs the read data from the read section 37 when the signal from the OR gate is at L-level. The output data from the multiplexer 47 is delivered to outside via latch circuits 48 and 49, and a tri-state buffer 50.

The multiplexer 34 selects the internal address signal W1ADD and supplies the same to a decoder 39 as an internal address signal WADD when the internal write-enable signal NWEin is at L-level, and selects the internal address signal RADD and supplies the same to the decoder 39 as an internal address signal AADD when NWEin is at H-level. In a read cycle, therefore, data read out from the memory cell array 36 by the read circuit 37 is delivered to outside based on the internal address signal RADD supplied to the decoder 39. In a write cycle, on the other hand, write data WD1 or WD2 supplied via the write circuit 38 is stored in the memory cell array 36 based on the internal address signal W1ADD supplied to the decoder 39.

The conventional SSRAM as described above may improve the bandwidth of data input/output by adjusting the read latency (three clocks) with the write latency (three clocks). This is achieved by storing write data and write address in the latch circuits 27, 30, 54 and 55, and performing a pipeline processing wherein the data stored in the latch circuits is supplied to the memory cell array 36 at the next write cycle in synchrony with the clock signal.

However, the difference between CAS latency in a read cyle and CAS latency in a write cycle is as high as three or four. If the latency difference is three, Y-address storage register must have a storage capacity as high as (Y-address length×3 bits), and the data storage register must have a storage capacity as high as (data length×3 bits) to adapt the latency difference. Thus, application of this configuration of the conventional SSRAM of FIG. 3 to a SDRAM, wherein write address and write data are stored and used during the next write operation, will result in a large chip size.

SUMMARY OF THE INVENTION

It is therefore an object of the present invention to provide a SDRAM which is capable of increasing the effective bandwidth of the data input/output terminals while suppressing the increase of the bits of the register and logic circuits to be added.

It is another object of the present invention to provide a SDRAM that performs a write operation with a higher priority while suppressing the increase of chip size.

The present invention provides a semiconductor memory device comprising a memory cell array including a plurality of memory cells, an address input section for receiving an address signal including address information in synchrony with an external clock signal, a read section for reading data from one of the memory cells specified by the address information in a read cycle, a write section for writing data to one of the memory cells specified by the address information, a data input section for receiving data from an external bus line to deliver the received data to the write section and for outputting data read by the read section to the external bus line, and a save section for temporarily storing, in a first write cycle, data read by the read section in a first read cycle preceding the first write cycle until a next read cycle.

In accordance with the semiconductor memory device of the present invention, when a write command is input succeeding to a read command, the data being read from the memory cell in the read cycle is temporarily stored in the save section and write data can be input from the data input/output section to be stored in the specified memory cell. After a next read command is input to the memory device, the data saved by the save section can be output through the data input/output section between the write operation and the next read operation based on the next read command. This increases the effective bandwidth of the data input/output terminals. It is sufficient that the save section have a capacity for storing a single read data.

The above and other objects, features and advantages of the present invention will be more apparent from the following description, referring to the accompanying drawings.

DETAILED DESCRIPTION OF THE PREFERRED EMBODIMENTS

Figure 1:
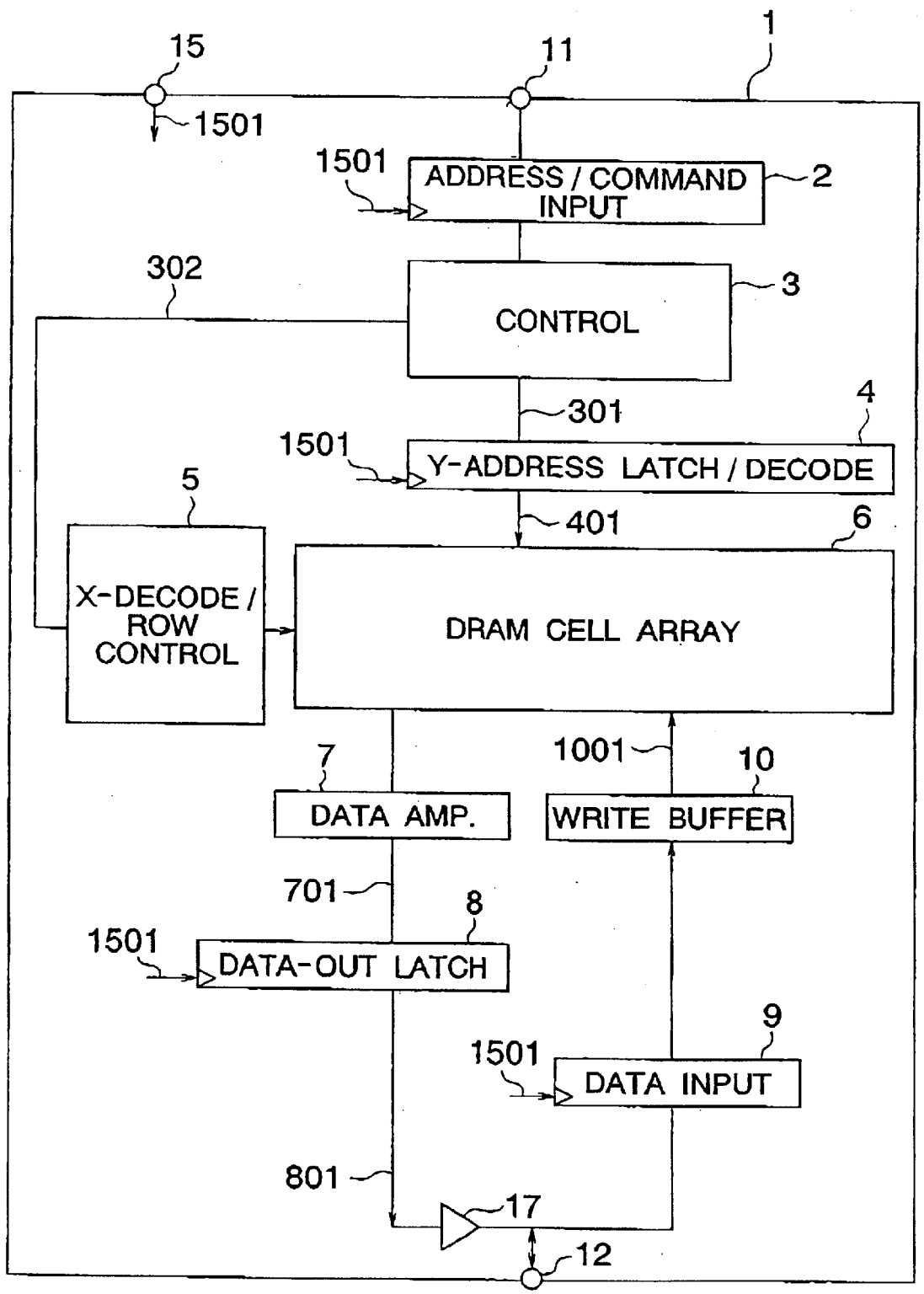
FIG. 1 is a block diagram of a conventional SDRAM.
Figure 2:
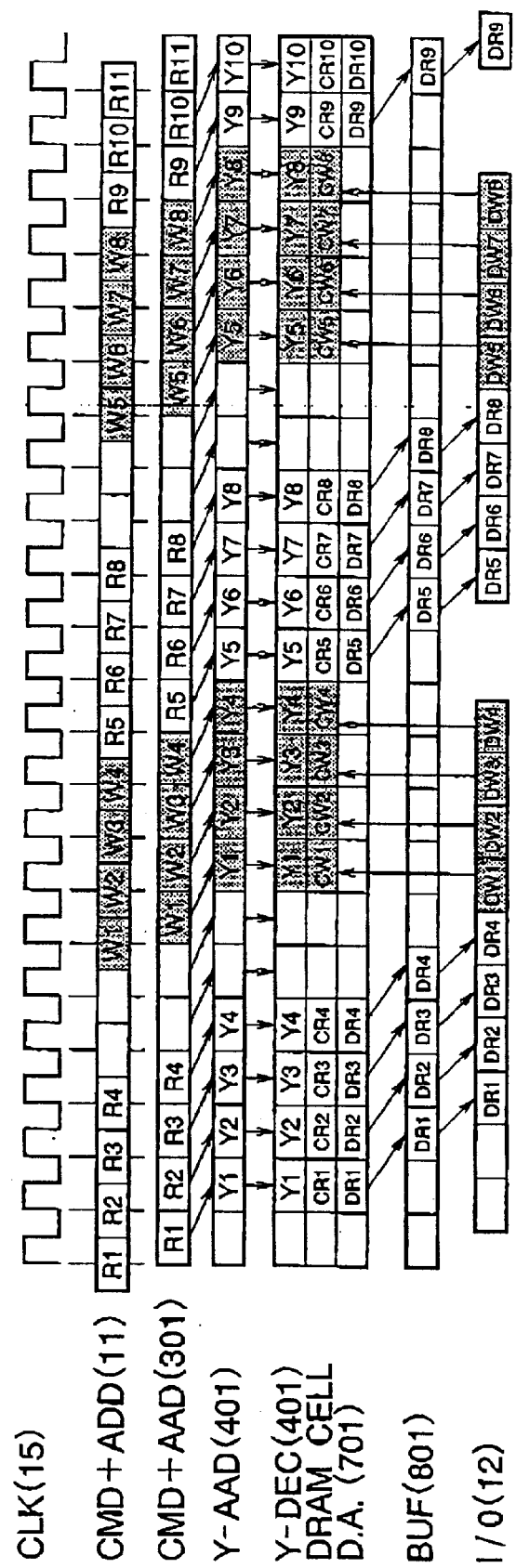
FIG. 2 is a timing chart of the SDRAM of FIG. 1.
Figure 3:
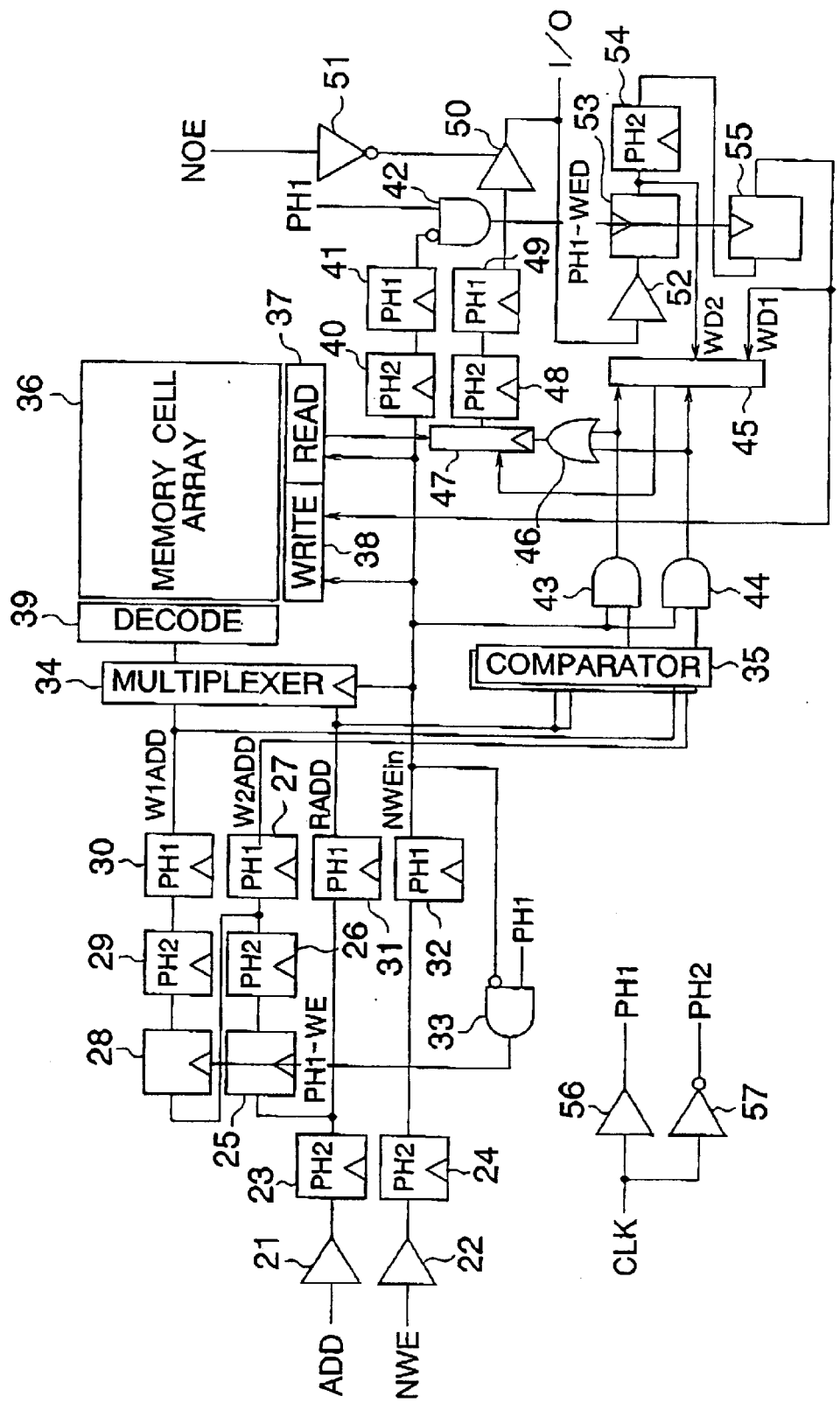
FIG. 3 is a block diagram of a conventional SSRAM
Figure 4:
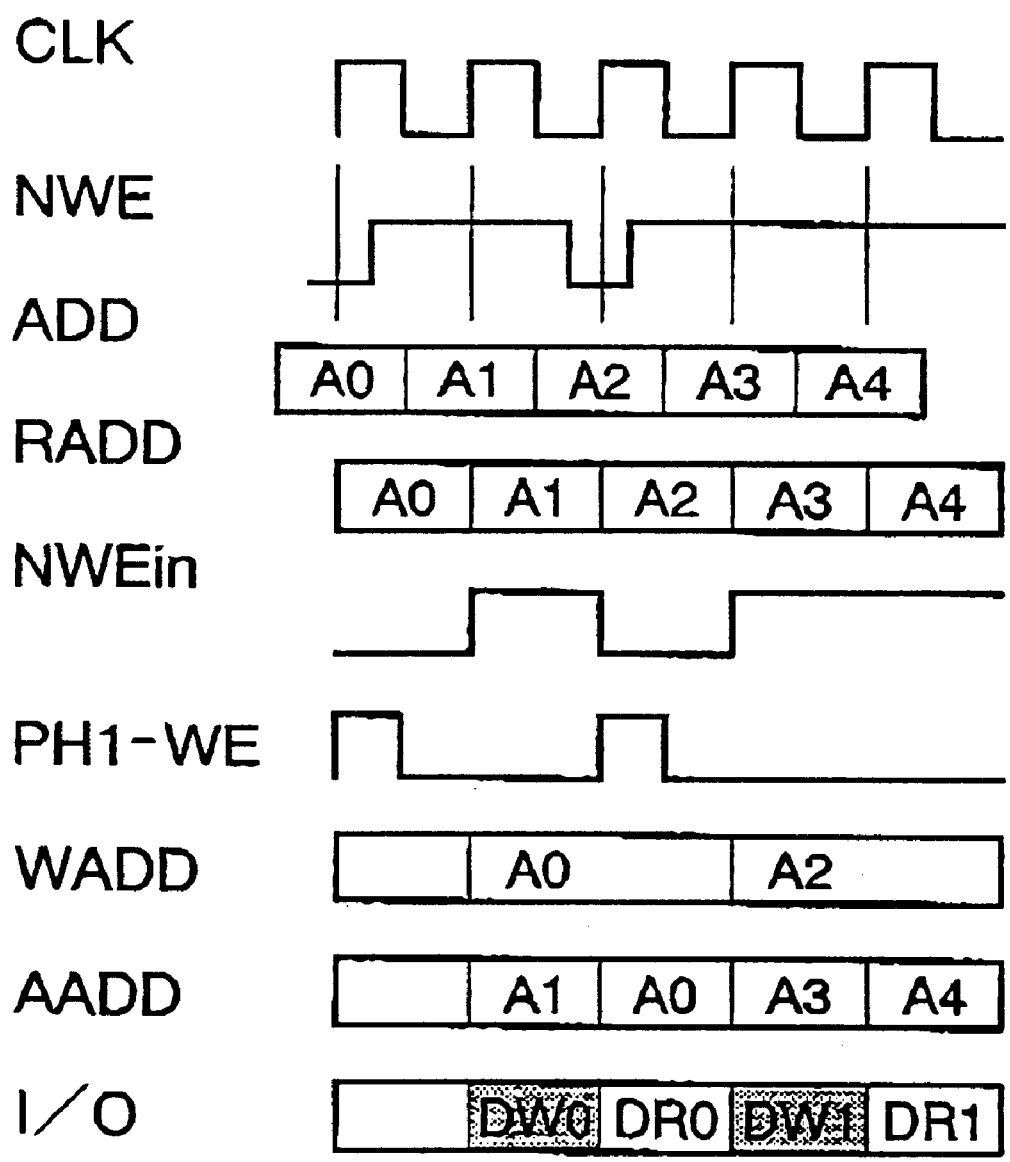
FIG. 4 is a timing chart of the SSRAM of FIG. 3.

Now, the present invention is more specifically described with reference to accompanying drawings, wherein similar constituent elements are designated by similar reference numerals.

Figure 5:
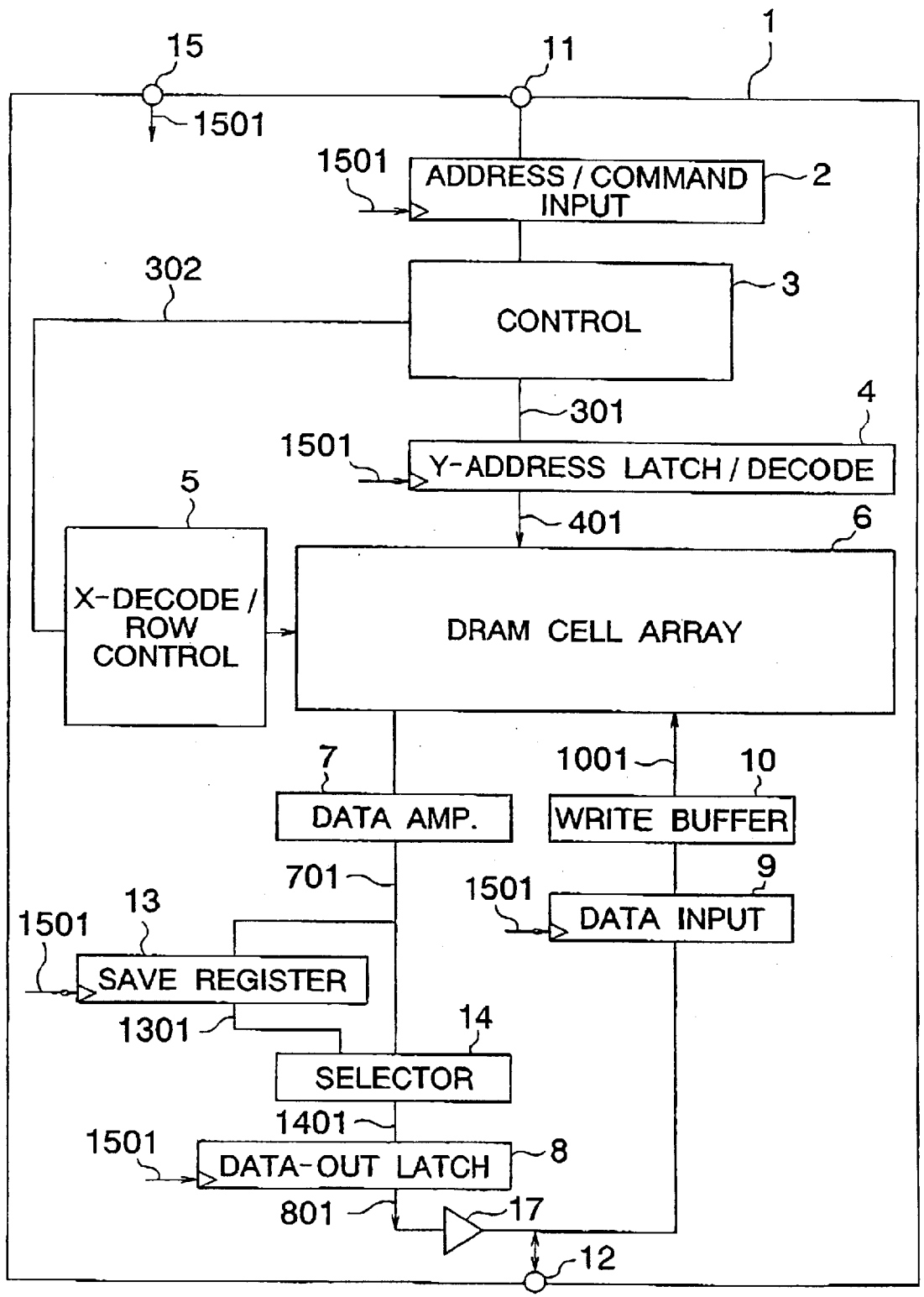
FIG. 5 is a block diagram of a SDRAM according to a first embodiment of the present invention.

Referring to FIG. 5, a SDRAM according to a first embodiment of the present invention is generally designated by numeral 1 and composes an address/command input section 2, a control section 3, a Y-address latch/decode section 4, an X-decoder and ROW control section 5, a dynamic memory cell array 6, a data amplifier 7, a save register 13, a save data selection section 14, a data-out latch 8, a data-out buffer 17, a data input section 9, and a write buffer 10. In short, the SDRAM of the present embodiment comprises the save register 13 and the save data selection section (selector) 14 in addition to the configuration of the SDRAM of FIG. 1.

The address/command input section 2 operates in synchrony with a clock signal 1501 transferred through a clock signal input terminal 15, receives addresses and/or commands input through address/command input terminals 11, and outputs addresses and/or commands to the control section 3. The control section 3 controls the operation of the SDRAM 1. The Y-address latch/decode section 4 latches, in synchrony with the clock signal 1501, Y-address signals 301 output from the control section 3, and outputs the latched signals to the memory cell array 6. The X-decode and ROW control section 5 receives X-addresses and control signals 302 output from the control section 3, and selects an X-address of the memory cell array 6.

The memory cell array 6 receives an X-address and a Y-address from the X-address and ROW control section 3 and the Y-address latch/decode section 4, respectively, and operates for reading or writing of data therefrom. The data amplifier 7 amplifies data read out from the specified memory cell in the memory sell array 6. The save register 13 receives an output signal 701 from the data amplifier 7, operates in synchrony with the clock signal, and latches the output data from the data amplifier 7.

The save data selection circuit 14 selects either the output signal 701 from the data amplifier 7 or the output signal 1301 from the save register 13, and outputs the selected one to a data-out latch 8. The data-out latch 8 operates in synchrony with the clock signal, receives the output signal 1401 from the save data selection section 14, and outputs the same in synchrony with the clock. The data-out buffer 17 receives data 801 from the data-out latch 8, and outputs the same to data input/output terminals 12. The data input section 9 receives data input from the data input/output terminals 12 in synchrony with the clock signal. The write buffer 10 writes the data input from the data. input section 9 into the specified memory cell in the memory cell array 6.

Figure 6:
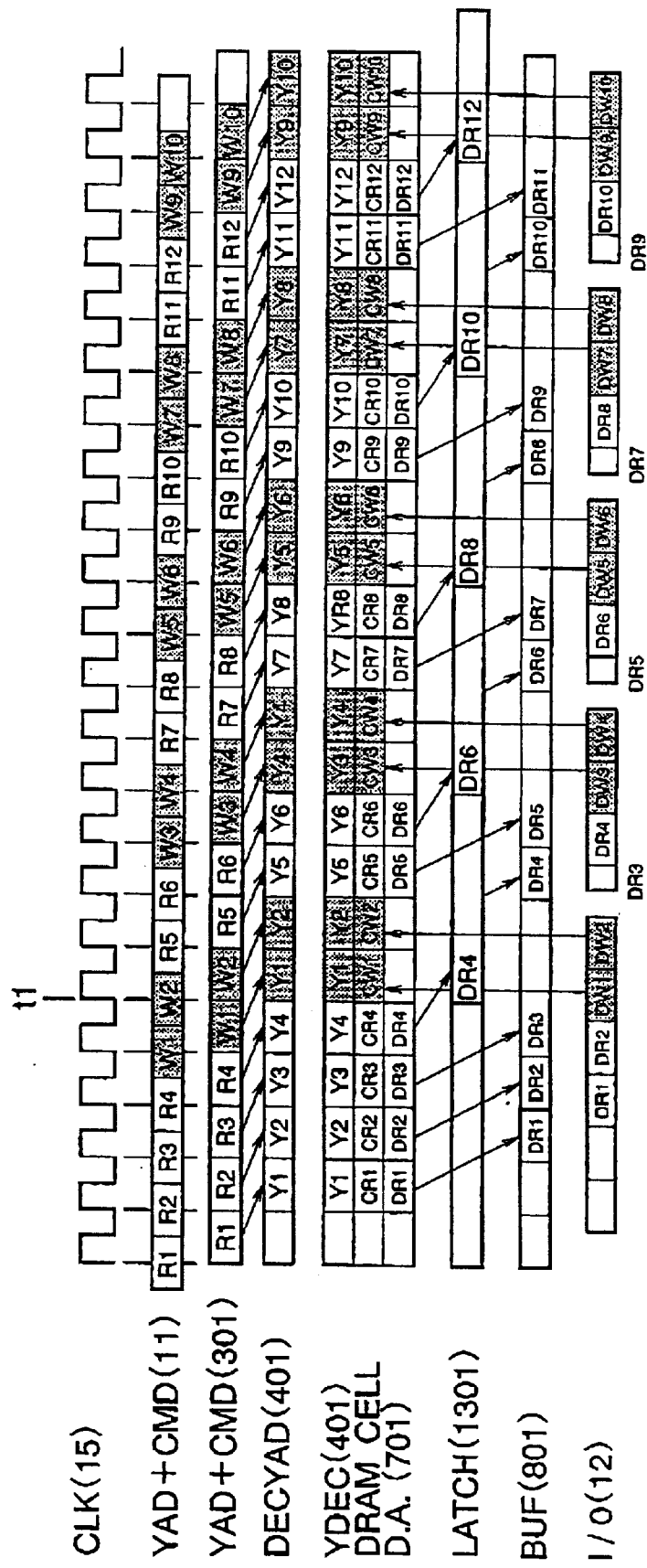
FIG. 6 is a signal timing chart of the SDRAM of FIG. 5.

Referring to FIG. 6, there is shown a signal timing chart of exemplified operation of the present embodiment, wherein R1 to R12 shown on the row of YAD+CMD (11) are read commands input through the address/command input terminals 11, and W1 to W10 are write commands. In a read cycle, a read command R1, for example, is latched in the address/command input section 2 in synchrony with the clock signal CLK input through the clock input terminal 15, and the Y-address signal for the read command R1 is delivered to the address bus 301 via the control section 3. The Y-address signal input to the Y-address latch/decode section 4 specifies the Y-address Y1 in the memory cell array 6 at the next clock cycle, and delivered to the memory cell array 6 via address line 401.

The memory cell in the memory cell array 6, specified by the Y-address Y1 together with the X-address not shown in FIG. 6 and having data CR1, outputs read data DR1 to the data amplifier (D.A.) 7. The read data DR1 is latched in the data-out latch 8 at the next clock via the save data selection circuit 14. The data latched in the data-out latch 8 is output through the data input/output terminals 12 via the data-out buffer 17.

In a write cycle, a write command W1, for example, input through the address/command input terminals 11 is latched in the address/command input section 2 in synchrony with the clock signal CLK. The control section 3 outputs the Y-address signal for the write command W1 to the address bus 301. The Y-address latch/decode section 4 latches and decodes, at the next clock, the Y-address signal, then outputs the obtained Y-address Y1 to the signal line 401 to specify the Y-address in the memory cell array 6.

Since, in this example, the command immediately preceding the subject write command W1 is a read command R4, the output signal from the data amplifier 7 which is halfway read at this stage of the clock signal is stored in the save register (LATCH) 13, and the memory cell array 6 interrupts the read operation. As shown in FIG. 6, after the write command W1 is input, the save register 13 stores the half-way read data DR4 supplied from the data amplifier 7, whereas the data-out latch (BUF) 8 still stores the read data DR3. At the clock having a clock edge denoted by t1, data DW1 is written in the memory cell as a write data CW1 within DRAM CELL, based on the data DW1 input through the data input/output terminals 12 or I/O (12).

Since a next read command R5 is input through the address/command input terminals 11 succeeding the write commands W1 and W2 in this example, the read operation based on the read command R4 is restarted. Specifically, the read command R5 is latched by the address/command input section 2, ad the Y-address signal in the read command R5 is delivered to the address bus 301 via the control section 3. Subsequently, at the next clock signal, the Y-address Y5 is received by the Y-address lach/decode section 4 and delivered to the memory cell array 6. Then, data is read based on the read command R5, and amplified by the data amplifier 7.

The save data selection circuit 14 operates to select the output from the save register 13 in synchrony with the next clock after the write operation based on the write command W2 preceding the read command R5 is completed. As a result, the data-out latch 8 latches the stored data DR4 of the save register 13, and outputs the data through the data-out buffer 17 and the data input/output terminals 12.

Subsequently, the save data selection section 14 is controlled to select the output data from the data amplifier 7, in synchrony with the next clock. The data DR5 read out from the memory cell in the memory cell array 6 based on the read command R5 is then latched by the data-out latch 8 through the data amplifier 7 and the save data selection. section 14. The latched data DR5 is output through the data-out buffer 17 and the data input/output terminals 12.

In the example of FIG. 6, the read data DR6 succeeding the read data DR5 remains to be stored in the data-out latch 8 and waits for the input of a next read command, that is R7 in this example. This is because the write data DW3 is input succeeding to the read command R6 from the data input/output terminals 12 based on the write command W3 before the output of the read data DR6 is completed.

Figure 7:
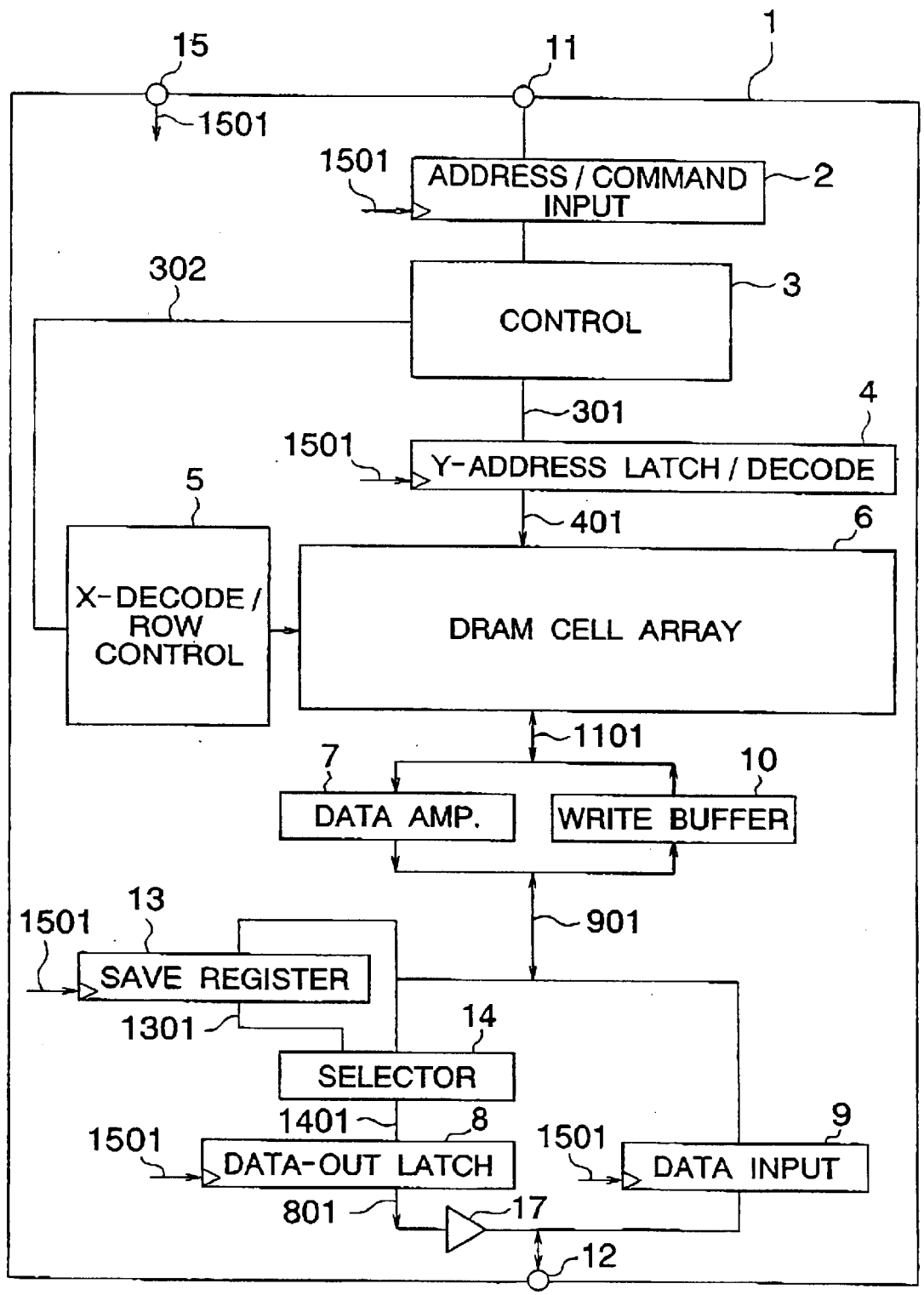
FIG. 7 is a block diagram of a SDRAM according to a second embodiment of the present invention.

Referring to FIG. 7, there is shown a SDRAM according to a second embodiment of the present invention, wherein the present invention is applied to a SDRAM having an internal data bus operating for dual directions of data flow. The dual-direction internal buses includes bus 901 and bus 1101 in this embodiment, and other configuration is similar to that of the first embodiment.

Figure 8:
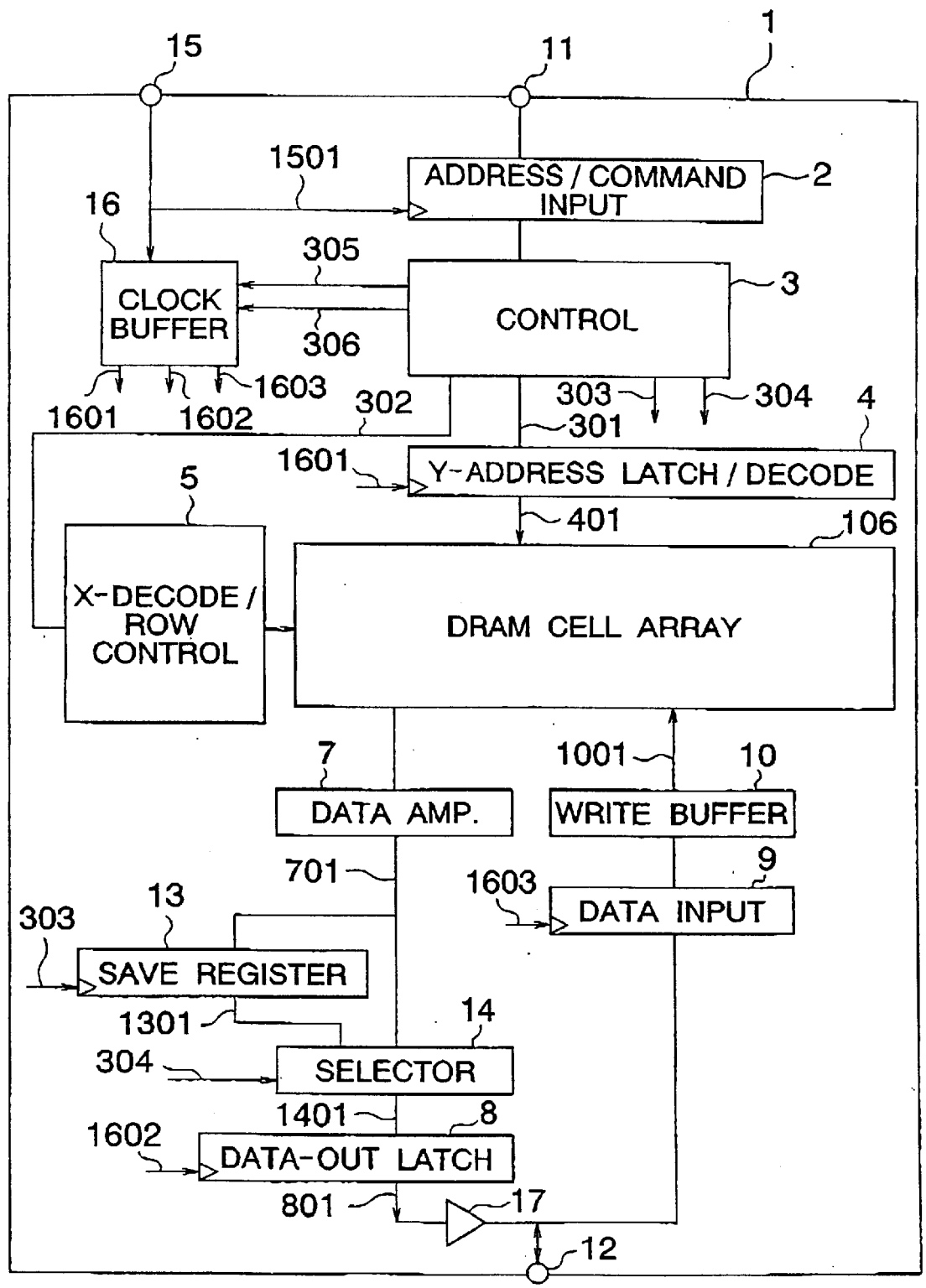
FIG. 8 is a block diagram of a practical configuration of a SDRAM implementing the first embodiment of the present invention.

Referring to FIG. 8, there is shown a practical example of the first embodiment of the present invention, wherein the control of the save register 13 and the save data selection section 14 is controlled based on the internal clock signals.

The SDRAM of FIG. 8 comprises a clock buffer 16 for receiving the external clock signal 1501 to supply an internal clock signal 1601 for controlling the overall operation of the SDRAM, a read clock signal 1602 for controlling a read cycle, and a write clock signal 1603 for is controlling a write cycle, all of which are in synchrony with the external clock signal. The output of the read clock signal 1602 and the write clock signal 1603 to each section is controlled by the control section 4.

Figure 9:
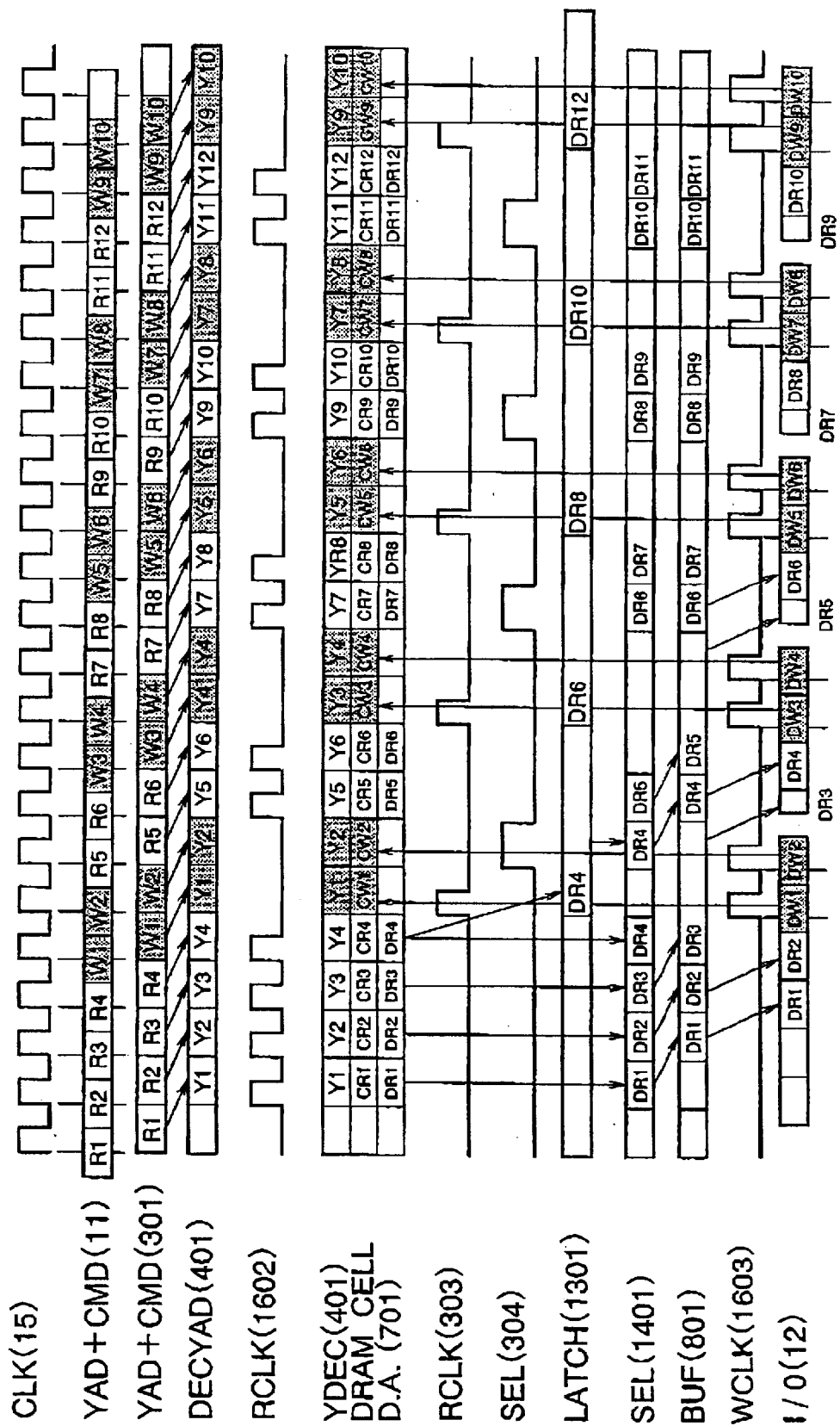
FIG. 9 is a timing chart of the SDRAM of FIG. 8.

Referring to FIG. 9, there is shown a signal timing chart of the SDRAM of FIG. 8. The control section 3, on receipt of a read command or a write command, outputs a save data latch signal denoted by RCLK(303) to the save register 13 and a data selection signal SEL(304) to the save data selection section 14. The save register (LATCH) 13 latches the output from the data amplifier 7 by responding to the save data latch signal 303. The save data selection section 14 selects either an output signal from the data amplifier (D.A.) 7 or an output signal from the save register 13 depending on L-level or H-level of the data selection signal 304 and supplies the selected data to the data-out latch 8.

When a write command W1 is input following a read command R4, the save register 13 saves the read data DR4 now under a halfway read operation, by responding to the clock signal RCLK (303), to thereby allow a write operation based on the write command W1 to be performed. After a next read command R5 following the write commands W1 and W2 is input to the SDRAM to end the write cycles, the output of the read data DR4 is performed by the save data selection section 14 selecting the output from the save register 14 in synchrony with the clock signal.

Figure 10:
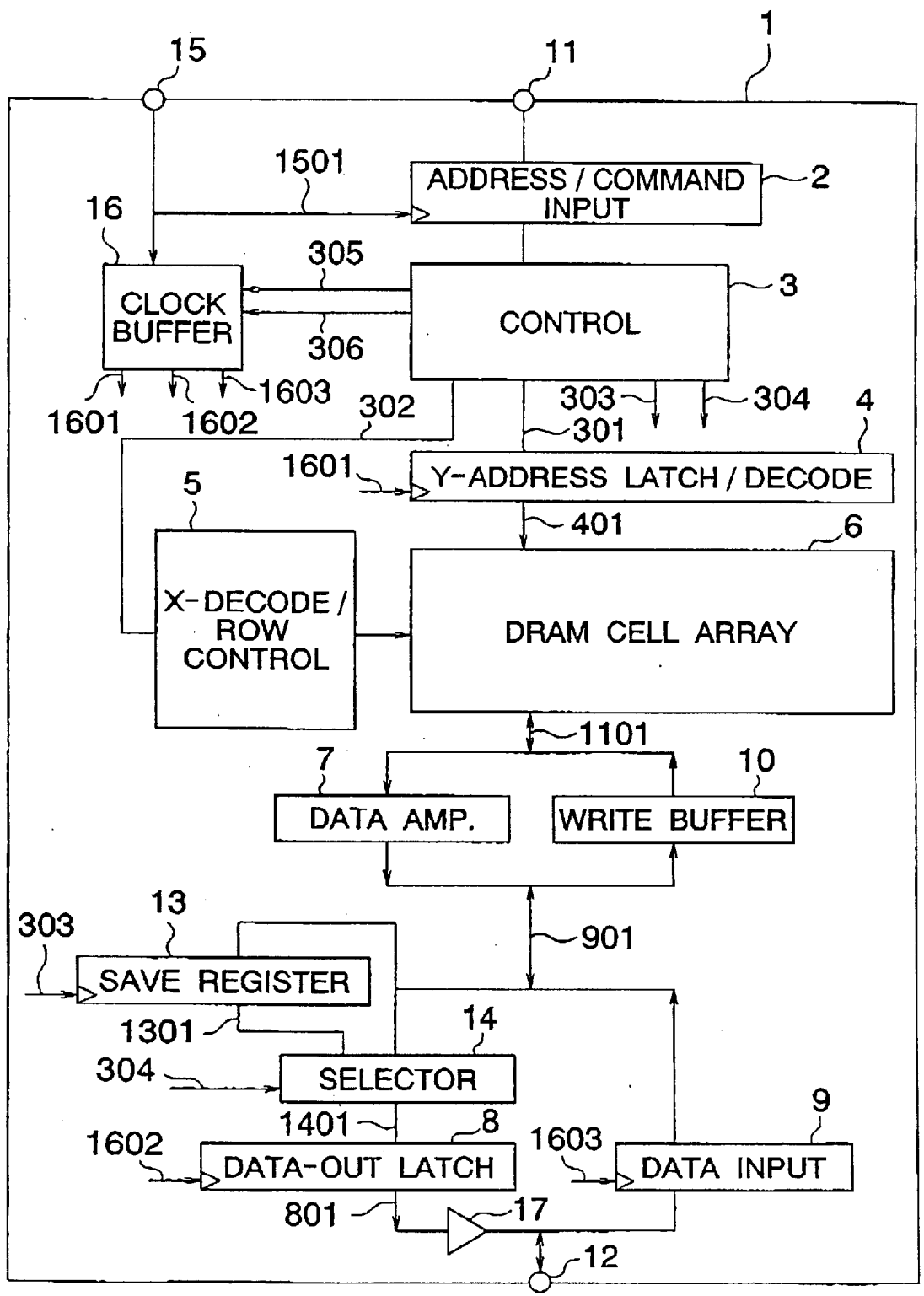
FIG. 10 is a block diagram of a SDRAM implementing the second embodiment of the present invention.

Referring to FIG. 10, there is shown a practical example of the second embodiment of the present invention having a dual-direction bus, wherein the save register 13 and the save data selection section 14 are controlled based on the internal clock signals. This example operates similarly to the example of FIG. 9 and the description thereof is omitted herein for avoiding duplication.

Since the above embodiments are described only for examples, the present invention is not limited to the above embodiments and various modifications alterations can be easily made therefrom by those skilled in the art without departing from the scope of the present invention.

What is claimed is:

1. A semiconductor memory device comprising a memory cell array including a plurality of memory cells, an address input section for receiving an address signal including address information in synchrony with an external clock signal, a read section for reading data from one of said memory cells specified by said address information in a read cycle, a write section for writing data to one of said memory cells specified by said address information, a data input section for receiving data from an external bus line to deliver the received data to said write section and for outputting data read by said read section to said external bus line, and a save section for temporarily storing, in a first write cycle, data read by said read section in a first read cycle preceding said first write cycle until a next read cycle.

2. A semiconductor memory device as defined in claim 1, wherein said address input section further receives a command signal for specifying a read cycle or a write cycle.

3. A semiconductor memory device as defined in claim 1, wherein said save section comprises a save register for storing data in said first write cycle and a selector for receiving outputs from said read section and said save register, said selector selecting an output from said save register in said next read cycle.

4. A semiconductor memory device as defined in claim 1, further comprising a clock buffer for receiving said external clock signal to output a read clock signal for controlling said save section.

5. A semiconductor memory device as defined in claim 1, wherein said read cycle involves a CAS latency of three clock pulses of said external clock signal.

6. A semiconductor memory device as defined in claim 1, further comprising an internal bus used in dual directions for reading data from and for writing data to said memory cells.

* * * * *